United States Patent [19]

Farwell

[11] Patent Number: 5,070,257
[45] Date of Patent: Dec. 3, 1991

[54] CIRCUITRY FOR CONTROLLED RATE OF POWER APPLICATION TO CMOS MICROCIRCUITS

[75] Inventor: William D. Farwell, Thousand Oaks, Calif.

[73] Assignee: Hughes Aircraft Company, Los Angeles, Calif.

[21] Appl. No.: 590,098

[22] Filed: Sep. 28, 1990

[51] Int. Cl.⁵ .............. H03K 3/017; H03K 19/003; H03K 17/16; H03K 3/013
[52] U.S. Cl. .............................. 307/296.3; 307/296.5; 307/591; 307/269; 307/480
[58] Field of Search ................. 307/296.3, 296.5, 591, 307/310, 480, 272.3, 269, 271

[56] References Cited

U.S. PATENT DOCUMENTS

| | | | |
|---|---|---|---|
| 4,719,368 | 1/1988 | Burkhardt | 307/296.3 |
| 4,977,335 | 12/1990 | Ogawa | 307/296.3 |
| 4,982,116 | 1/1991 | Lee | 307/480 |

Primary Examiner—John Zazworsky
Assistant Examiner—Scott A. Ouellette
Attorney, Agent, or Firm—Leonard A. Alkov; W. K. Denson-Low

[57] ABSTRACT

A method and circuitry for controlling the rate of power dissipation of CMOS microcircuits during start-up. In accordance with the invention, either the clock frequency or the duty cycle of clock activity is changed, from zero at the instant of application of the power supply voltage, to the final operating frequency or activity at the end of a warm-up period. As a result, transient temperature differentials between integrated circuit die and the substrates to which they are attached are minimized, increasing the reliability of the CMOS circuitry.

11 Claims, 2 Drawing Sheets

FOR A BURST PERIOD OF N, TRUE AVAILABLE DUTY CYCLES ARE $0, \frac{1}{N}, \frac{2}{N}, \frac{3}{N}, \ldots \frac{N-2}{N}, \frac{N-1}{N}, 1$

EXAMPLES FOR N=10

DUTY CYCLE = 1

$\frac{8}{10}$ $\frac{5}{10}$ $\frac{2}{10}$ $\frac{1}{10}$

EXAMPLE FOR N=10, LUMPED DISTRIBUTION $\frac{5}{10}$

CIRCUITRY FOR CONTROLLED RATE OF POWER APPLICATION TO CMOS MICROCIRCUITS

BACKGROUND OF THE INVENTION

The present invention relates to integrated circuits employing Complementary Metal-Oxide-Semiconductor (CMOS) technology, and more particularly to circuitry for controlling the rate of change of power dissipation of CMOS integrated circuits.

CMOS digital microcircuits are in widespread use today, as a result of their low power consumption requirements. Because of the complimentary nature of the gate circuits employed in CMOS circuits, wherein P-channel and N-channel transistors are connected in parallel and gated by a common gating signal, power is consumed only when the gate switches from one digital state to the other. When the gate is quiescent, either the P or N channel transistor comprising the complimentary gate circuit is nonconductive, so that current may not flow through the gate.

FIG. 1 illustrates a typical CMOS integrated circuit device 10. As is well known, the microcircuits are formed on an integrated circuit die 12, which is mounted on a substrate 14. Electrical connection is made between the microcircuits on the die 12 and the substrate. Such connections can be made in many different ways, for example, by wires 16 which are bonded to terminal pads defined on the die 12 and to terminal pads on the substrate 14. Another common technique is to mount the die on a leadless chip carrier, and the electrical connections are made by contact of pad "bumps" on the die and corresponding "bumps" formed on the surface of the carrier substrate.

The device 10 typically includes a number of input terminals $I_O$–$I_N$ for receiving input signals, and a plurality of output terminals $O_O$–$O_N$ at which the device output signals appear. The device 10 receives power from a voltage source $V_{CC}$, and may receive clock signals from an external clock. The device 10 may also or alternatively include an internal clock generator for generating clock signals. The clock rate determines the rate at which digital operations are performed by the microcircuits comprising the device 10.

In CMOS digital circuits the power dissipation is a direct function of the number of gates that change state per unit of time, the capacitive loads driven by the gates, and the square of the power supply voltage.

The majority of digital system are synchronous in nature, where fixed clocks sequence operations, and logic activity is instigated on each "tick" of the clocks. In synchronous digital circuits, the number of gates transitioning per unit time depends on the total number of gates in the integrated circuit, the percentage of those gates that change state per clock, and the clock rate. The percentage of gates that change state per clock is determined by the particular program and/or data being processed.

When power is fully applied at turn-on of CMOS circuits, there develops a thermal shock (rapid change of temperature differential) which causes mechanical stress and reduces reliability of the physical and electrical connections between die and substrates. This is also true of subsequent substrate-to-substrate connections in the packaging chain.

Virtually all digital systems have an implicit or explicit reliability goal. On new systems, both the much larger size of integrated circuit (IC) chips and novel packaging schemes (e.g., leadless chip carriers) have caused temperature differentials and thermal shock to become an important factor in reliability. Since most new digital designs use CMOS devices, the invention is widely applicable to help alleviate these problems.

In most cases, power is simply applied "all at once," giving rise to the temperature differential problem. In some cases, this problem could be addressed by controlling the rate of power application by varying the voltage from the power supply. Varying the power supply voltage over time from zero to the final value makes the power supply considerably more complex, and may be impossible for many systems. Furthermore, the digital system cannot operate for a fraction of the warm-up period (during which the voltage is too low.)

SUMMARY OF THE INVENTION

The invention is a simple means to control the rate of change of power dissipation of CMOS integrated circuits, achieved by controlling the number of gates transitioning per unit time. The power control in accordance with the invention is easily implemented in any system, and allows operation during the entire warm-up period (albeit at a lower than normal rate). This is done by changing either the clock frequency or the duty cycle of clock activity, from zero at the instant of application of power supply voltage, to the final operating frequency or activity at the end of a warm-up period.

The purpose of the invention is to minimize rate of change of temperature, and temperature differentials between integrated circuit die and the substrates to which they are attached.

By controlling the rate of power application (i.e., increasing power slowly rather than all at once), the rate of change of temperature may be reduced.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

The invention affects the number of gates transitioning per unit time to control power dissipation. Specifically, the power dissipated by a CMOS integrated circuit (IC) is controlled by varying the clock rate from zero, at the application of the power supply voltage, to the final, steady-state value, after a warm-up period. The duration of the warm-up period is determined by the particular thermal and mechanical characteristics of each particular system. During the warm-up period, the IC must be excited by a pre-defined set of program and/or data patterns. The pre-defined excitation may be a set of stored patterns which perform system self-test or calibration, or may be designed solely for the start-up process. A very simple example of an excitation pattern would be the following set of binary levels applied to the respective inputs of a 2-input gate: 00, 01, 10, 11. This pattern of four vectors is repeated for whatever length of time is required. However, for more complex microcircuits, a predefined excitation pattern may consist of tens of thousands of bits. If one wishes to quantify the power dissipation in watts/second during the warm-up process, one needs to know the power dissipation at full clock rate caused by the pre-defined set of data patterns.

The clock rate may be controlled in one of two ways: by changing the frequency of the clock generator, or by leaving the frequency fixed (at its final frequency) and selectively "gating off" a varying percentage of the individual clocks. The latter method is generally more readily applied to most digital systems, and an exemplary implementation will be described in further detail.

Figure 1:
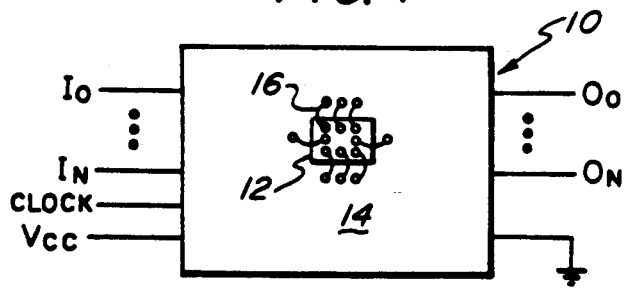
FIG. 1 is a simplified block diagram illustrative of a conventional CMOS integrated circuit device.
Figure 2A:
FIGS. 2A and 2B are timing diagram of clocks gated to various duty factors in accordance with the invention.
Figure 2A:
Figure 2A:
Figure 2A:
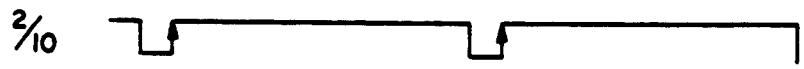
Figure 2A:
Figure 2B:

FIGS. 2A and 2B are timing diagrams of clocks gated to various duty factors. These figures illustrate a burst period of n (the burst period is a recurring sequence of N clocks, of which a varying number are gated off). The clocks within a burst period which are gated off may be either distributed through the period or lumped together. FIG. 2A shows an example of N=10, and a distributed distribution for duty cycles of 1, 8/10, 5/10, 2/10 and 1/10. FIG. 2B shows the "gated off" clocks lumped together for the example of N=10, and a duty cycle of 5/10. If there are dynamic devices in the system, which have a maximum allowable clock-to-clock time (clock period), a distributed distribution may be required to keep the clock period in specification. The burst period may be of any length; longer burst periods allow finer control of power, but periods should be short in respect to the thermal time constant of the die and substrates. Typical burst periods may range between one microsecond and one millisecond.

Figure 3:
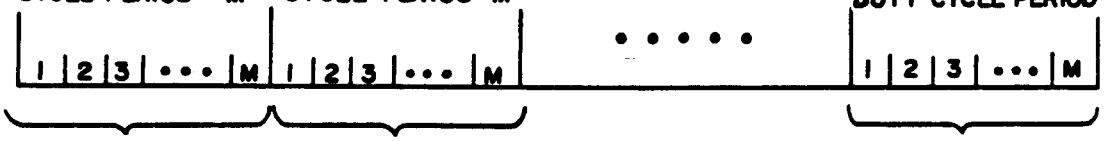
FIG. 3 illustrates how the duty factor for the clocks of FIG. 2 is incremented over time.

FIG. 3 shows how the duty cycle is incremented over time. The duty cycle generator is updated every power increment period, and this continues until 100% duty cycle is attained at the Kth setting of the duty cycle.

Figure 4:
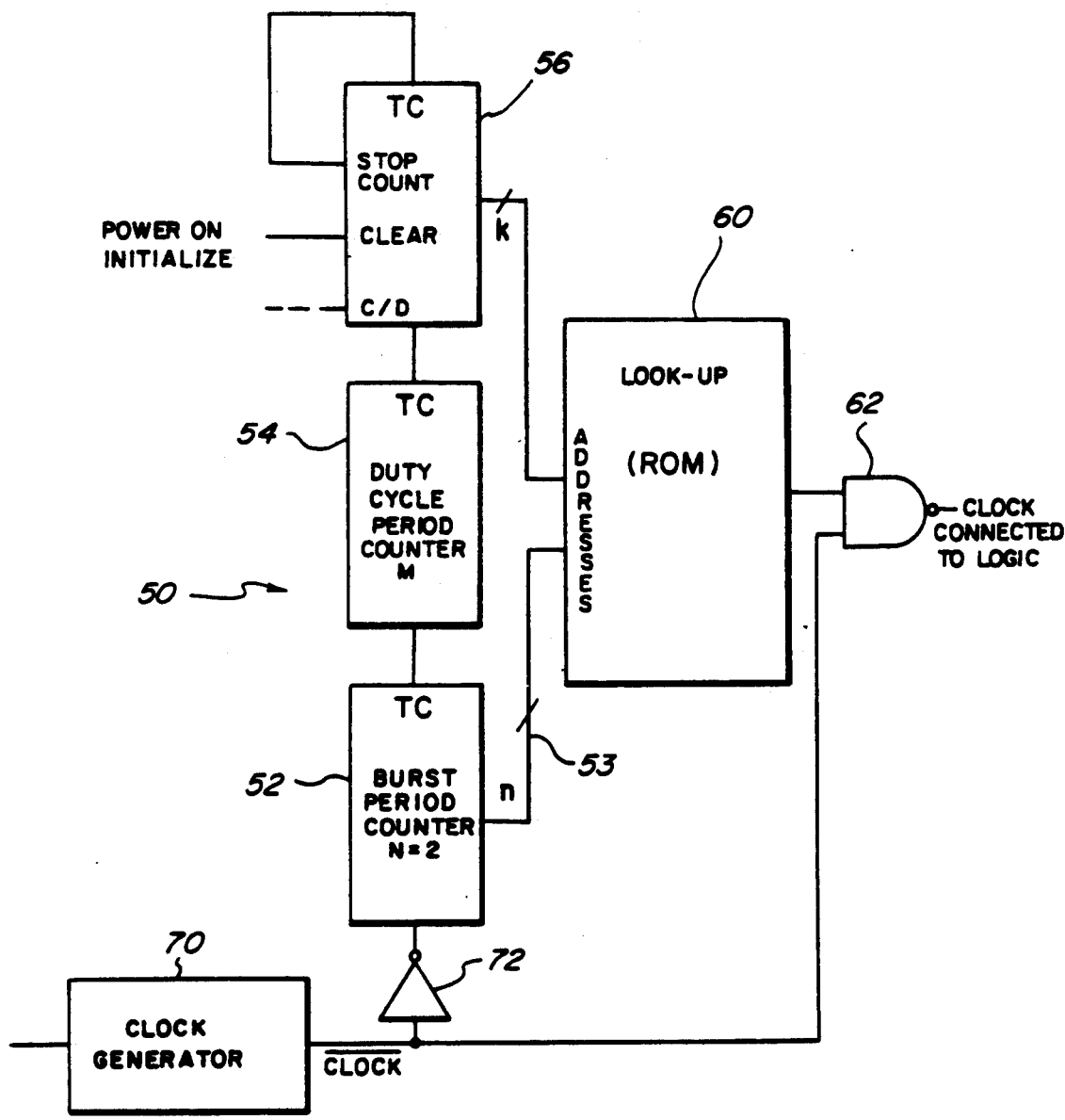
FIG. 4 is a simplified block diagram of a CMOS integrated circuit device employing circuitry in accordance with the invention to vary the duty cycle of the clocks.

FIG. 4 is a block diagram of an exemplary duty cycle generator circuit 50 for controlling the rate of power application to CMOS microcircuits using counters and a ROM look-up table to gate off the clocks at the appropriate times.

The generator circuit 50 is responsive to the clock signal(s) either generated on-chip by clock generator 70, or to externally supplied clock signals used to clock the circuit on the chip. Thus, the exemplary clock generator 70 provides an exemplary clock signal $\overline{CLOCK}$, and may either be part of the internal chip circuitry or external to the chip. The generator circuit 50 comprises three cascaded binary counters 52, 54, and 56, a look-up table ROM addressed by the count states of counters 52 and 56, and a logical NAND gate 62. The first counter 52 is incremented or clocked by an inverted form (through invertor 72) of the clock signal $\overline{CLOCK}$. Counter 52 serves as the burst period counter, wherein $N=2^n$, and there are n bit lines 53 which define the count state of the counter. The counter state lines 53 are connected to the ROM 60 to provide address data.

Counter 54 services as the duty cycle period counter, and is incremented by the true carry output of the burst period counter 52. When the counter 52 reaches its maximum count state, the time carry signal increments the state of counter 54. When the count state of counter 54 reaches M, the maximum count state, its true carry signal increments the total period counter 56. The counter 56 is cleared by the power-on initialize signal, generated at the instant power is applied to the chip. As is well known to those skilled in the art, a power-on initialize signal is typically required and available in microprocessor-based systems, for example, and is generated by the power supply itself or by a simple RC circuit. When the count of counter 56 reaches its maximum state, the true carry output pulse the "stop count" input of the counter 56 stopping the count of counter 56 at its maximum count state. The K bit lines defining the count state of counter 56 also serve as address inputs to ROM 60.

The ROM 60 generates a "clock enable" signal which defines the clock activity during the start up period.

The following parameters are settable, by programming the ROM, to match any thermal requirements: Burst period N (determining the fineness of duty cycle setting); Duty cycle period M (determining the duration at a particular duty cycle—time = M × N clocks); and the total number of different duty cycle settings K (typically set equal to N). Multiple sets of parameters may be stored in the ROM to allow selection of any of a number of start-up characteristics.

This procedure allows use of a fixed frequency clock source (e.g., crystal oscillator) used in most digital systems, maintains clock synchronisity and edge fidelity, and allows any desired degree of control of power application rate.

By making the total period (K) counter an UP/DOWN counter, an inverse power-down process may be done prior to turning-off the power supply voltage. Thus, control of rate of change of power dissipation at turn-off is easily accomplished, if required.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. Circuitry for controlled rate of power application to a complementary-metal-oxide-semiconductor (CMOS) microcircuit fabricated on an integrated circuit die which is attached to a substrate, and which is powered by a power supply voltage level, the microcircuit further characterized in that it is operated once the microcircuit has reached steady-state operation by a clock signal with an associated duty cycle operating at a predetermined steady-state rate, comprising:

means for controlling the number of gates transitioning per unit time during a warm-up period of predetermined length, thereby minimizing rapid transient temperature differentials between the microcircuit die and the substrate on which it is attached wherein said controlling means comprises means for changing the clock rate from zero at the commencement of application of the power supply voltage to the steady-state clock rate after the warm-up period.

2. The circuitry of claim 1 wherein said controlling means comprises means for changing the duty cycle of the clock signal activity, from zero at the commencement of the application of the power supply voltage to unity after the warm-up period.

3. The circuitry of claim 2 wherein said means for changing the clock duty cycle comprises means for gating off a varying percentage of the individual clock pulses, wherein the percentage of gated off pulses varies from 100% at the commencement of application of the power supply voltage to 0% after the warm-up period.

4. The circuitry of claim 1 wherein said CMOS microcircuit is further characterized by one or more input terminals for receiving excitation signals, and wherein said controlling means further comprises means for exciting said microcircuit input terminals during said warm-up period by a predefined set of data patterns.

5. The circuitry of claim 4 wherein said predefined set of data patterns creates a known microcircuit power dissipation at the full clock rate.

6. A method for controlled rate of power application to a complementary-metal-oxide-semiconductor (CMOS) microcircuit fabricated on an integrated circuit die which is attached to a substrate, and which is powered by a power supply voltage level, wherein the microcircuit is characterized by one or more input terminals for receiving excitation signals and the microcircuit is further characterized in that it is operated once the microcircuit has reached steady-state operation by a clock signal with an associated duty cycle operating at a predetermined steady-state rate, comprising the following steps:

controlling the number of CMOS gates transitioning per unit time during a warm-up period of predetermined length, thereby minimizing rapid transient temperature differentials between the microcircuit die and the substrate on which it is attached.

7. The method of claim 6 wherein said step of controlling the number of CMOS gates transitioning per unit time comprises changing the clock rate from zero at the commencement of application of the power supply voltage to the steady-state clock rate after the warm-up period.

8. The method of claim 6 wherein said step of controlling the number of CMOS gates transitioning per unit time comprises changing the duty cycle of the clock signal activity, from zero at the commencement of the application of the power supply voltage to unity after the warm-up period.

9. The method of claim 8 wherein said step of changing the clock duty cycle comprises gating off a varying percentage of individual clock pulses, wherein a percentage of "gated off" pulses varies from 100% at the commencement of application of the power supply voltage to 0% after the warm-up period.

10. The method of claim 6 wherein the method further comprises the step of exciting the microcircuit during said warm-up period by a pre-defined set of data patterns.

11. The method of claim 10 wherein said predefined set of data patterns causes a known microcircuit power dissipation at the full clock rate.

* * * * *